(12) United States Patent
Claessens et al.

(10) Patent No.: US 8,432,529 B2
(45) Date of Patent: Apr. 30, 2013

(54) LITHOGRAPHIC APPARATUS AND MONITORING METHOD

(75) Inventors: Bert Jan Claessens, Spalbeek (BE);
Paul Van Der Veen, Waalre (NL);
Herman Philip Godfried, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 372 days.

(21) Appl. No.: 12/822,447

(22) Filed: Jun. 24, 2010

(65) Prior Publication Data

US 2011/0026001 A1 Feb. 3, 2011

Related U.S. Application Data

(60) Provisional application No. 61/230,006, filed on Jul. 30, 2009.

(51) Int. Cl.
*G03B 27/72* (2006.01)
*G03B 27/52* (2006.01)

(52) U.S. Cl.
USPC .............................................. 355/35; 355/55

(58) Field of Classification Search .................... 355/53, 355/55, 35
See application file for complete search history.

(56) References Cited

U.S. PATENT DOCUMENTS

| | | | | |
|---|---|---|---|---|
| 6,516,013 | B1 * | 2/2003 | Patzel et al. | 372/29.02 |
| 6,737,622 | B1 | 5/2004 | Jeong et al. | |
| 2002/0057724 | A1 * | 5/2002 | Vogler et al. | 372/58 |
| 2003/0090643 | A1 * | 5/2003 | Sato | 355/69 |
| 2009/0279065 | A1 * | 11/2009 | Furukawa | 355/68 |
| 2010/0012818 | A1 * | 1/2010 | Baker et al. | 250/201.9 |

* cited by examiner

*Primary Examiner* — Peter B Kim
*Assistant Examiner* — Deoram Persaud
(74) *Attorney, Agent, or Firm* — Pillsbury Winthrop Shaw Pittman LLP (57) ABSTRACT

A lithographic apparatus including a radiation beam monitoring apparatus, the radiation beam monitoring apparatus including an optical element configured to generate a diffraction pattern, and an imaging detector located after the optical element and not in a focal plane of the optical element such that the imaging detector is capable of detecting a mixture of spatial coherence and divergence of the radiation beam.

17 Claims, 4 Drawing Sheets

Figure 5   Position [m] X10⁻³

Figure 6

LITHOGRAPHIC APPARATUS AND MONITORING METHOD

CROSS REFERENCE TO RELATED APPLICATIONS

This application claims priority and benefit under 35 U.S.C. §119(e) to U.S. Provisional Patent Application No. 61/230,006, entitled "Lithographic Apparatus and Monitoring Method", filed on Jul. 30, 2009. The content of that application is incorporated herein in its entirety by reference.

FIELD

The present invention relates to a lithographic apparatus and a monitoring method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

Lithographic apparatus use a radiation beam to illuminate the patterning device, and thereby provide patterned radiation which is projected onto the substrate. Properties of the radiation beam are selected in order to provide a high quality image at the substrate. One of the properties of the radiation beam which may be selected is the angular distribution of radiation within the radiation beam. This property is conventionally referred to as the illumination mode. Illumination modes which are commonly used include annular, dipole, and quadruple modes.

The illumination mode which is selected when projecting a given pattern onto a substrate will depend upon properties of that pattern. It is desirable therefore for a lithographic apparatus to be able to switch between illumination modes, in order to allow the lithographic apparatus to accurately project different patterns onto a substrate. In some instances it may be desirable to switch rapidly between illumination modes. For example, if two patterns are being consecutively imaged onto a given substrate (an approach known as double patterning), then it may be desirable to use a first illumination mode when projecting the first pattern onto the substrate, and switch to a second illumination mode when projecting the second pattern onto the substrate. Switching rapidly between the first and second illumination modes allows the lithographic apparatus to have a higher throughput.

In order to be able to rapidly switch between illumination modes, a lithographic apparatus may be provided with an illumination mode selector which includes an array of mirrors (or other reflective elements) that may be used to select different illumination modes.

SUMMARY

It is desirable to be able to monitor properties of the radiation beam. This may be to check for example that the radiation beam is not likely to damage components of the lithographic apparatus. It may be to check for example that the radiation beam is capable of providing an illumination mode of sufficiently high quality.

According to an aspect of the invention, there is provided a lithographic apparatus including a radiation beam monitoring apparatus, the radiation beam monitoring apparatus including an optical element configured to generate a diffraction pattern, and an imaging detector located after the optical element and not in a focal plane of the optical element such that the imaging detector is capable of detecting a mixture of spatial coherence and divergence of the radiation beam.

According to a further aspect of the invention, there is provided a monitoring method including using an optical element and an imaging detector which is not located in a focal plane of the optical element to obtain an image of a radiation beam of a lithographic apparatus, the image providing information relating to a mixture of spatial coherence and divergence of the radiation beam.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The patterning device may be held by a support structure. The support structure may hold the patterning device in a way which depends on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

Figure 1:
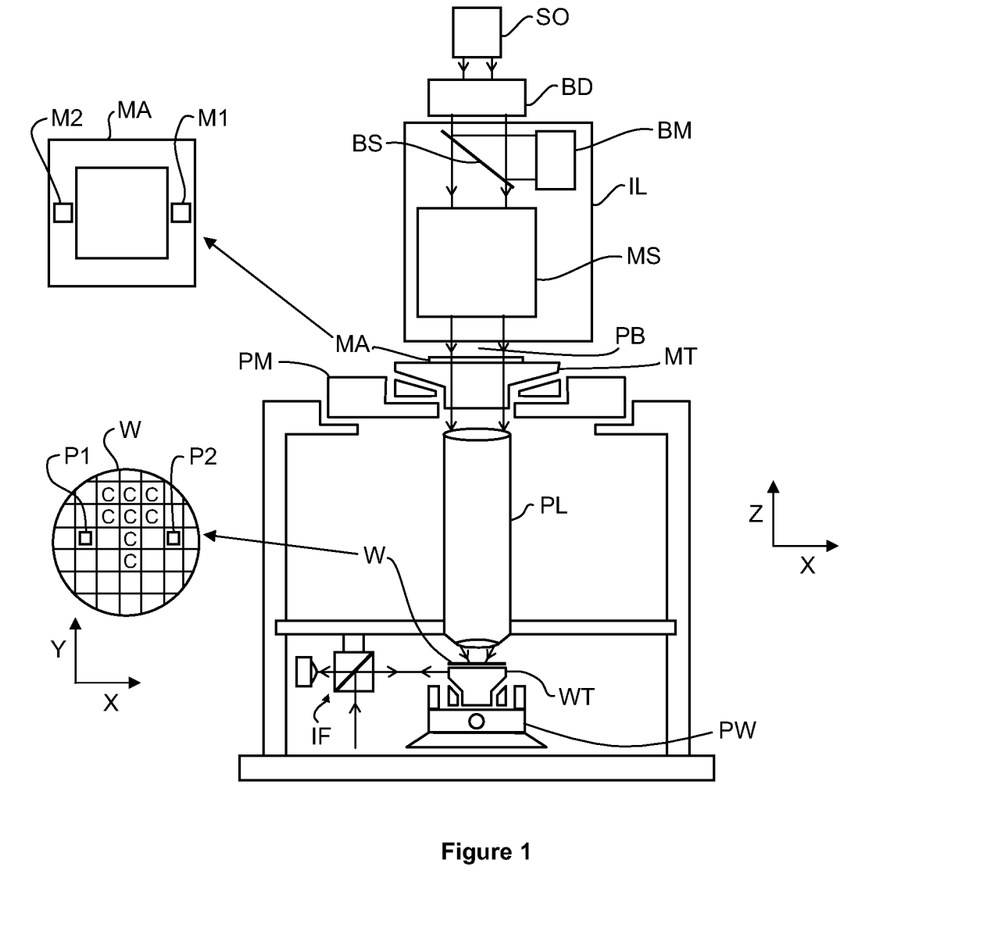
FIG. 1 schematically depicts a lithographic apparatus according to an embodiment of the invention.

FIG. 1 schematically depicts a lithographic apparatus according to an embodiment of the invention. The apparatus includes:

an illumination system (illuminator) IL to condition a beam PB of radiation (e.g. DUV radiation or EUV radiation).

a support structure (e.g. a support structure) MT to support a patterning device (e.g. a mask) MA and connected to first positioning device PM to accurately position the patterning device with respect to item PL;

a substrate table (e.g. a wafer table) WT to hold a substrate (e.g. a resist-coated wafer) W and connected to second positioning device PW to accurately position the substrate with respect to item PL; and a projection system (e.g. a refractive projection lens) PL configured to image a pattern imparted to the radiation beam PB by patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The radiation beam is passed from the source SO to the illuminator IL with the aid of a beam delivery system BD including for example suitable directing mirrors and/or a beam expander. The source SO and the illuminator IL, together with the beam delivery system BD if required, may be referred to as a radiation system.

The illuminator IL includes an illumination mode selector MS which allows an illumination mode to be selected. The illuminator further includes a beam-splitter BS which is arranged to direct a small proportion of the radiation beam PB towards a radiation beam monitoring apparatus BM. The illumination mode selector MS and the radiation beam monitoring apparatus are described further below.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
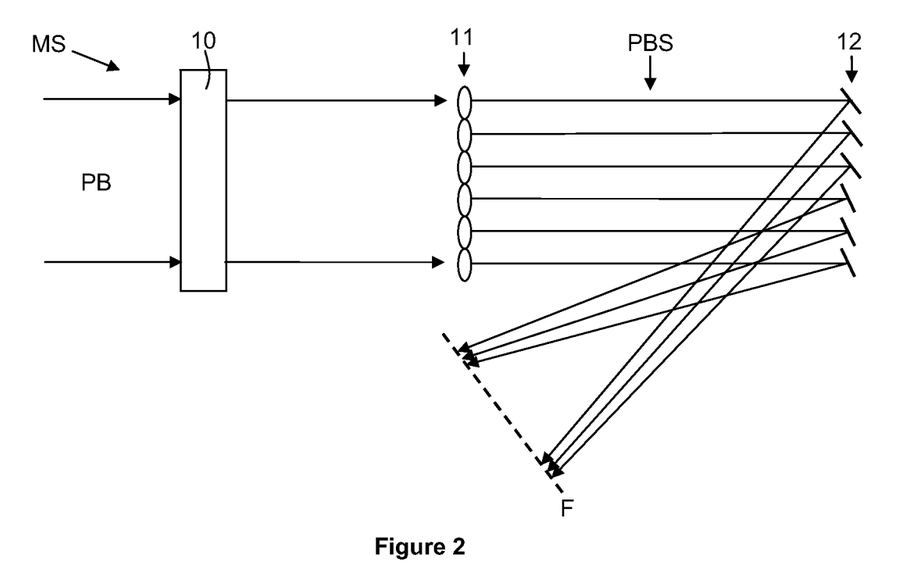
FIG. 2 schematically depicts an illumination mode selector of the lithographic apparatus of FIG. 1.

FIG. 2 shows schematically the illumination mode selector MS of the illuminator IL. The illumination mode selector MS includes a homogenizer 10, a micro-lens array 11 and a mirror array 12. The radiation beam PB is homogenized by the homogenizer 10. The radiation beam PB is then incident upon the micro-lens array 11, which is configured to convert the radiation beam PB into a plurality of sub-beams PBS. Each sub-beam PBS is incident upon a mirror of the mirror array 12, and is reflected towards a focal plane F.

As an example in FIG. 2, the mirrors of the mirror array 12 are oriented such that the sub-beams are grouped together as two groups at the focal plane F. The orientations of the mirrors of mirror array 12 may be modified in order to form other groups of sub-beams, or to spread the sub-beams out across the focal plane F.

The homogenizer 10 may for example be a fly's eye homogenizer which includes a first lens array and a second lens array (not illustrated), or any other suitable form of homogenizer. Although the micro-lens array 11 and the mirror array 12 are shown as one-dimensional in FIG. 2, they are both two-dimensional. The micro-lens array 11 may include several thousand micro-lenses. Similarly, the mirror array 12 may include several thousand mirrors.

An illumination mode may be selected using the illumination mode selector MS by choosing appropriate orientations for the mirrors of the mirror array 12. FIG. 2 shows in a simplified manner the way in which a dipole mode may be formed. Other modes may be formed in an analogous way. A more detailed description of the manner in which a micro-lens array and mirror array may be used to form illumination modes is described in U.S. Pat. No. 6,737,622 the contents of which are herein incorporated by reference.

It is desirable to avoid damage of optical components of the lithographic apparatus (e.g. the homogenizer 10 or the mirror array 12). One way in which optical components of the lithographic apparatus might be damaged is if high intensity radiation is incident upon them. The optical components may be designed such that they are capable of receiving radiation which has an intensity less than a predetermined threshold. However, there may be a risk that a spatially localised peak of intensity could occur in the radiation beam. The intensity of the spatially localised peak may be higher than the predetermined threshold, and may therefore cause damage to optical components (e.g. the homogenizer 10 or the mirror array 12).

It is desirable to avoid situations in which destructive interference within one or more of the radiation sub-beams PBS causes the one or more sub-beams to be extinguished (or substantially reduced in intensity), since this may have a detrimental effect upon the quality of the illumination mode provided by the illuminator IL. Conversely, it is desirable to avoid situations in which constructive interference within one or more of the radiation sub-beams PBS causes the one or more sub-beams to have a significantly enhanced intensity, since this may also have a detrimental effect upon the quality of the illumination mode provided by the illuminator IL.

The above undesirable situations are linked to the spatial coherence and divergence of the radiation beam PB (where spatial coherence refers to coherence across a cross-section of the radiation beam). The spatial coherence and divergence of the radiation beam are coupled. It is desirable to have a radiation beam PB which has low spatial coherence and high divergence, since this will reduce the likelihood that the above undesirable situations occur.

Figure 3:
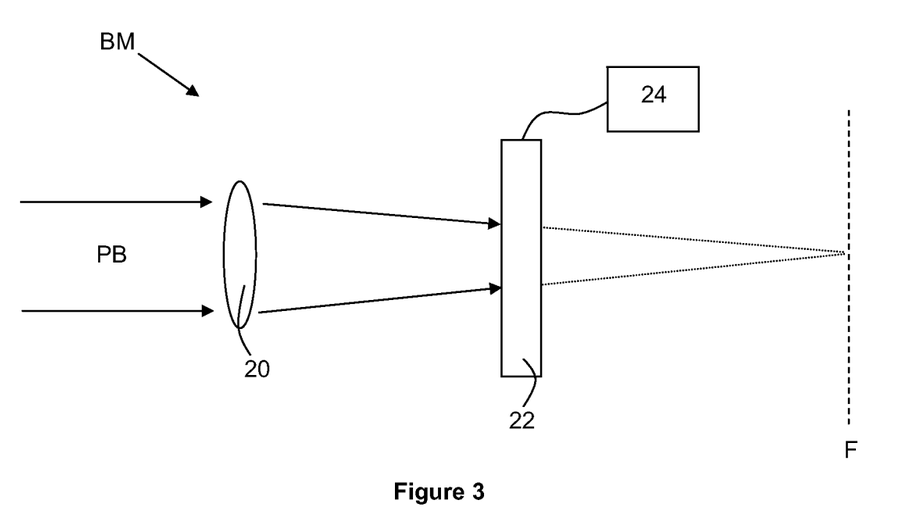
FIG. 3 schematically depicts a radiation beam monitoring apparatus according to an embodiment of the invention, which forms part of the lithographic apparatus of FIG. 1.

FIG. 3 shows schematically the radiation beam monitoring apparatus BM of FIG. 1. The radiation beam monitoring apparatus includes a lens 20 which is configured to receive the radiation beam PB and focuses the radiation beam to a focal plane F. An imaging detector 22 is located between the lens 20 and the focal plane F. An analysis system or analyzer 24 is connected to the imaging detector 22 and receives output from the imaging detector.

Although FIG. 3 includes dotted lines which travel beyond the imaging detector 22 and meet at the focal plane F, these are intended merely to show schematically that the radiation beam PB is converging at the focal plane, and are not intended to imply that radiation passes through the imaging detector.

The radiation beam monitoring apparatus BM allows properties of the radiation beam PB to be monitored. This may allow identification of conditions in the radiation beam PB which could lead to a spatially localised peak of intensity that could cause damage to the homogenizer 10, mirror array 12, or other optical component of the lithographic apparatus. It may also allow identification of conditions in the radiation beam PB which could give rise to unwanted intensity modulation due to destructive and or constructive interference at the mirror array 12.

Since the imaging detector 22 is located between the lens 20 and the focal plane F, it is not located in a field plane of the radiation beam monitoring apparatus BM nor is it located in a pupil plane of the radiation beam monitoring apparatus. Instead, it is located somewhere between these two planes. Consequently, the radiation beam PB when incident upon the imaging detector 22 provides neither an image of a preceding plane, nor a Fourier transform of an image of a preceding plane. Instead, the radiation beam PB at the imaging detector may be thought of as a mixture of an image and a Fourier transform.

The radiation beam monitoring apparatus BM does not provide a measurement of a particular optical property of the radiation beam PB such as divergence or spatial coherence. Instead, the radiation beam monitoring apparatus BM provides a measurement which is a mixture of divergence and spatial coherence. The measured mixture is weighted by the intensity profile of the radiation beam. This measured mixture of divergence and spatial coherence is linked to the existence of spatially localised peaks of intensity in the radiation sub-beams PBS. The measured mixture of divergence and spatial coherence is also linked to the existence of unwanted intensity modulation at the mirror array 12.

The radiation beam monitoring apparatus BM may also provide a measurement of the effective fluence, derived from the total signal measured by the imaging detector 22.

It is desirable to have a radiation beam PB in the lithographic apparatus which has low spatial coherence and high divergence. If the radiation beam PB were to have high spatial coherence and low divergence, then a small change in the optical path of part of the radiation beam would be likely to give rise to constructive and destructive interference in the radiation beam. Constructive interference may cause spatially localised intensity peaks in the radiation beam PB which might damage the homogenizer 10, mirror array 12, or other optical component of the lithographic apparatus. Destructive interference may cause one or more sub-beams PDS to be extinguished (or substantially reduced in intensity), and constructive interference may cause one or more sub-beams PBS to be enhanced in intensity, thereby reducing the quality of the illumination mode provided by the illuminator IL.

Divergence and spatial coherence are interlinked, and it is the combination of divergence and spatial coherence which may cause the above identified problems. It is therefore beneficial to measure the mixture of divergence and spatial coherence.

The imaging detector 22 receives an image which provides information relating to the mixture of divergence and spatial coherence. The position of the imaging detector 22 in relation to the lens 20 and the focal plane F is selected such that the detected image includes peaks which may be analysed in order to monitor the mixture of spatial coherence and divergence. If the imaging detector 22 were to be located adjacent to the lens 20, then the radiation beam would be a smooth profile which would not provide a significant amount of information relating to spatial coherence or divergence. On the other hand, if the imaging detector 22 were to be located in the focal plane F, then the imaging detector would see a focused spot of radiation which would have a very high intensity and would not provide a significant amount of information relating to spatial coherence or divergence. The position of the imaging detector 22 is somewhere between these extremes, such that the imaging detector sees a modulated radiation beam whose characteristics are determined by coherence properties of the radiation beam. The imaging detector 22 thus provides an image which may be analysed in order to monitor the mixture of spatial coherence and divergence in the radiation beam.

In one example the lens 20 has a focal length of 450 mm, and the imaging detector 22 is located 200 mm away from the lens 20. It is not necessary that the imaging detector 22 be located at exactly this distance from the lens 20. Providing the imaging detector 22 at other distances from the lens 20 may still provide useful measurements of the mixture of spatial coherence and divergence. For example, it may be possible to locate the imaging detector 22 between 150 and 250 mm from the lens 20.

The lens 20 may for example be 0.7 mm in diameter.

The imaging detector may for example be a CCD or CMOS detector. The imaging detector may for example have a pixel size of 10 microns squared.

Although FIG. 3 shows the imaging detector 22 as being before the focal plane F of the lens 20, the imaging detector may be after the focal plane of the lens (the imaging detector should not be provided in the focal plane of the lens). Providing the imaging detector 22 after the focal plane F would increase the length of the radiation beam monitoring apparatus BM.

The distance between the lens 20 and the imaging detector 22 may be at least one quarter of the distance between the lens 20 and the focal plane F. The distance between the imaging detector 22 and the focal plane F may be at least one quarter of the distance between the lens 20 and the focal plane F. The distance between the imaging detector 22 and the focal plane F may be at least half of the distance between the lens 20 and the focal plane F.

Figure 5:
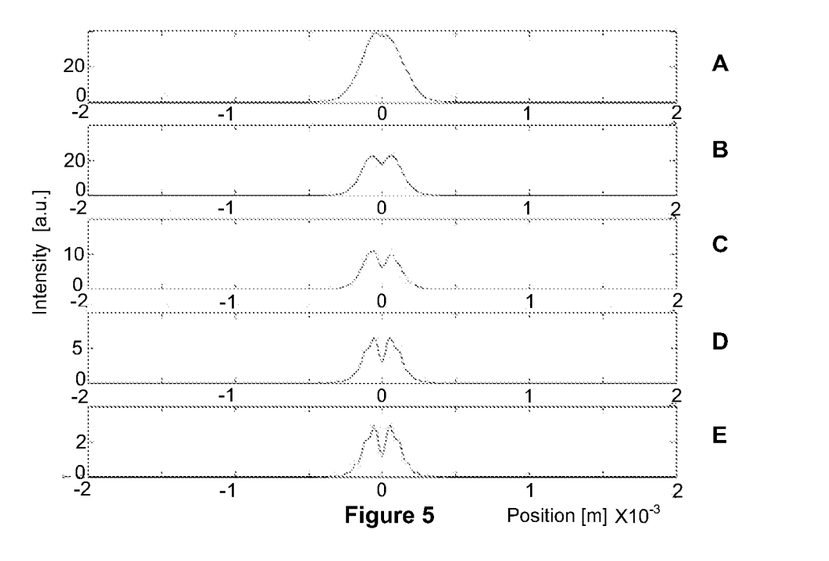
Figure 6:
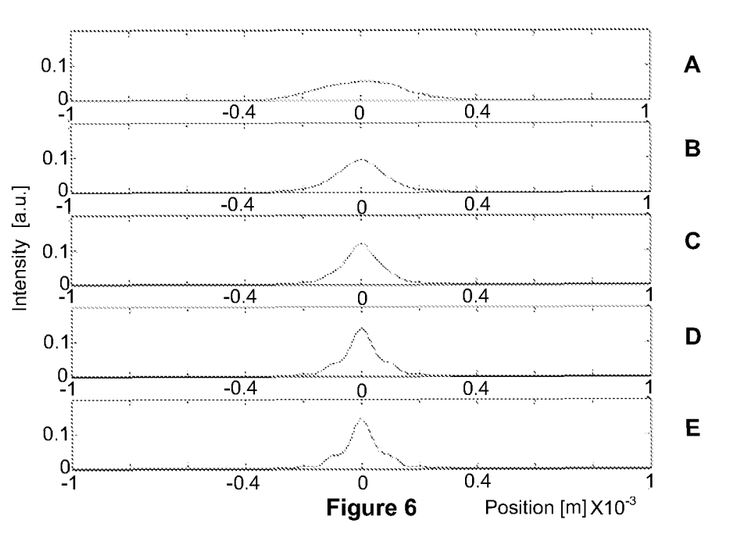

A simulation has been performed in which the spatial coherence and divergence of a radiation beam was modified, and the results were simulated at the mirror array 12, the imaging detector 22 and the homogenizer 10 (where the homogenizer includes two lens arrays and the results were simulated at the second lens array of the homogenizer). The results of the simulation are shown in FIGS. 4 to 6.

Figure 4:
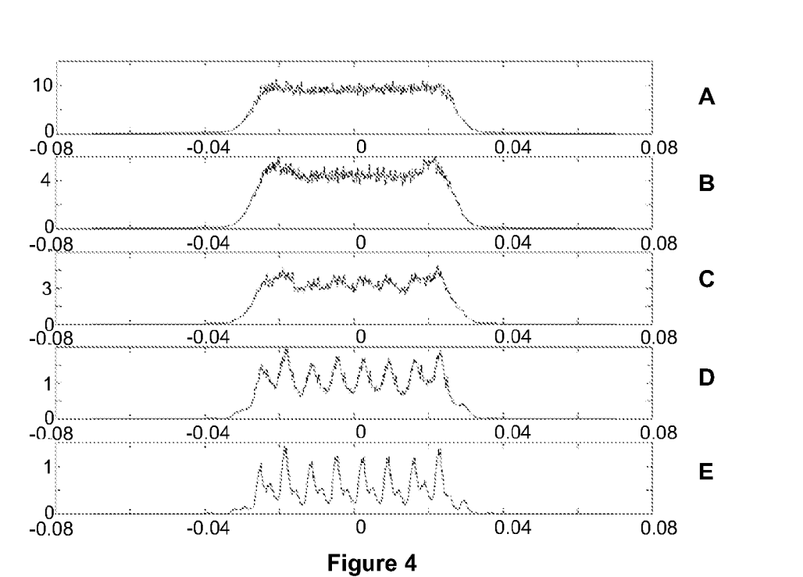
FIGS. 4 to 6 show the results of a simulation of the embodiment of the invention.

FIG. 4 shows the intensity of the simulated radiation beam at the mirror array 12. In FIG. 4A the radiation beam has a low spatial coherence and a high divergence. The spatial coherence increases and the divergence reduces in each subsequent figure. In FIG. 4E the radiation beam has high spatial coherence and low divergence. As can be seen from FIG. 4, when the radiation beam has high spatial coherence and low divergence, spatially localised peaks of intensity are present in the radiation beam (as shown in FIGS. 4D and 4E). The spatially localised peaks of intensity are caused by interference in the radiation beam.

The spatially localised peaks of intensity may affect the quality of the illumination mode which is provided by the illuminator IL. At one moment a given mirror of the mirror array 12 may experience a spatially localised peak of intensity. At some time later, due to translational drift (e.g. thermal drift) or laser drift (e.g. pointing drift) causing a change in the interference pattern which causes the spatially localised peak of intensity, the spatially localised peak of intensity may have shifted away from the mirror. This will change the illumination mode which is formed by the mirror array 12. Conversely there may have been a spatially localised dip of intensity on a given mirror, which may shift away from that mirror due to drift. This will also change the illumination mode which is formed by the mirror array 12. The spatially localised peaks of intensity thus reduce the accuracy with which the illumination mode is formed. The illumination mode may be described as being unstable.

In contrast, when the radiation beam has low spatial coherence and high divergence, then only very small fluctuations of intensity are seen (as shown in FIG. 4A). Consequently, there is no risk of damage to the mirror array 12, and no risk that interference effects arising from drift of the radiation beam will significantly affect the illumination mode. It may therefore be considered desirable to operate with a radiation beam as shown in FIG. 4A. It may be the case that operating with a radiation beam as shown in any of FIGS. 4A-C avoids risking damage to the mirror array 12 and avoids reducing the quality of the illumination mode. It may be desirable to use the radiation beam monitoring apparatus BM to ensure that the radiation beam remains within the operating regime shown in FIGS. 4A-C.

FIG. 5 shows the intensity of the simulated radiation beam at the imaging detector 22 (i.e. images which would be detected by the radiation beam monitoring apparatus BM). It can be seen from FIG. 5A that if the radiation beam has a low spatial coherence and high divergence, then the imaging detector 22 sees a single peak in which a central dip is discernable. As the spatial coherence increases and the divergence decreases, the size of the central dip grows. As a consequence of the growth of the central dip, two peaks are seen in FIG. 5E.

FIG. 6 shows the intensity of the simulated radiation beam at homogenizer 10. In FIG. 6A, the radiation beam has a low spatial coherence and high divergence, and can be seen to deliver intensity which has an even distribution. As the spatial coherence increases and the divergence decreases, the intensity distribution of the radiation becomes less even. Eventually, when the spatial coherence is high and the divergence is low, the radiation beam includes a high intensity peak (as shown in FIG. 6E). This high intensity peak may cause damage to the homogenizer 10 (e.g. at the second lens array of the homogenizer).

FIGS. 4 to 6 demonstrate that properties of the radiation beam seen by the imaging detector 22 of the radiation beam monitoring apparatus BM are directly linked to the existence of localised peaks of intensity in the radiation beam at the mirror array 12, and to an uneven intensity distribution at the homogenizer 10 (e.g. at the second lens array of the homogenizer).

The radiation beam monitoring apparatus BM may be used to monitor the mixture of spatial coherence and divergence. The image detected by the imaging detector 22 may be analysed by the analyzer 24, in order to determine whether properties of the mixture of divergence and spatial coherence exceed one or more predetermined thresholds. This provides an indication of whether or not the radiation beam is likely to cause damage to the homogenizer (or other optical components of the lithographic apparatus) and/or provide an illumination mode which is of poor quality. In the event that the mixture of divergence and spatial coherence has a property which exceeds a pre-determined threshold, the analyzer may take action. The action may for example include issuing a warning, protecting the lithographic apparatus by blocking the radiation beam PB, or automatically adjusting a parameter of the lithographic apparatus in order to provide a correction of the radiation beam PB.

The analyzer 24 may analyse the images provided by the imaging detector 22 in one or more of the following ways:
1. Deconvoluting the detected image with an image which would be expected if the radiation beam were to have a high spatial coherence and low divergence, measuring the width of the resulting profile, and then comparing the measured width with one or more threshold widths.
2. Measuring the contrast of the image, for example by comparing the peak intensity of the image with the intensity at the lowest point of the dip in the image, and comparing the measured contrast with one or more threshold contrast values. The contrast measurement may take into account the width of the image.
3. Cross-correlating the image with an image which would be expected if the radiation beam were to have a high spatial coherence and low divergence, and comparing a resulting cross-correlation value with one or more threshold cross-correlation values.
4. Performing a grid deformation fit of the detected image, and comparing the results with one or more threshold values.

As mentioned further above, the lens 20 may for example be 0.7 mm in diameter. However, the lens may have some other diameter. The lens diameter should be sufficiently small that it causes the radiation beam PB to form a modulated beam whose characteristics are determined by coherence properties of the radiation beam. For example, for a radiation beam having a wavelength of 193 nm, the lens diameter may for example be less than 10 mm, less than 5 mm, or less than 1 mm.

Although the radiation beam monitoring apparatus BM shown in FIG. 3 includes a lens 20, it is not essential that a lens is used. The lens may be replaced by any optical element which creates a diffraction pattern with a detectable characteristic that is caused by coherence effects. The lens may, for example, be replaced with a pinhole, or some other optical element which is configured to generate a suitable diffraction pattern. The optical element may provide a modulated beam whose characteristics are determined by coherence properties of the radiation beam. The modulated beam may have a modulation depth which is sufficiently large to be detected by the imaging detector 22. The modulated beam may have a modulation depth which falls within the dynamic range of the imaging detector 22.

The radiation beam monitoring apparatus BM may be located in the illuminator IL as shown schematically in FIG. 1, or may be at some other suitable location. For example, the radiation beam monitoring apparatus BM may be located at the source SO, or at the beam delivery system BD. The source SO may include a pulse stretcher which may be arranged to increase the diameter of the radiation beam and/or change the divergence of the radiation beam. Where this is the case, if the radiation beam monitoring apparatus BM is located before the pulse stretcher, then the relationship between the image seen by the imaging detector 22 and the properties of the radiation beam PB at homogenizer 10 and mirror array 12 may be less direct. Calculations which take into account the effect of the pulse stretcher may be used in order to determine the relationship. Alternatively, the relationship may be determined using measurements.

The ratio of distances between the homogenizer 10, mirror array 12 and focal plane F of the illumination mode selector MS may be substantially equal to the ratio of distances between the lens 20, imaging detector 22 and focal plane F of the radiation beam monitoring apparatus BM.

In some instances, the radiation beam monitoring apparatus BM may include an array of lenses (or other optical elements) rather than a single lens (or other optical element). For example, an array of a few hundred or a few thousand lenses may be used. A benefit of this approach is that it more closely replicates what is occurring in the illumination mode selector MS of the illuminator IL, since the illumination mode selector may include an array of several hundred to several thousand lenses.

The mirror array 12 is merely an example of an array of reflective elements. Other arrays of reflective elements may be used.

While specific embodiments of the invention have been described above, it will be appreciated that the invention may be practiced otherwise than as described. The description is not intended to limit the invention.

The invention claimed is:

1. A lithographic apparatus comprising a radiation beam monitoring apparatus, the radiation beam monitoring apparatus comprising an optical element configured to generate a diffraction pattern, and an imaging detector located after the optical element and not in a focal plane of the optical element such that the imaging detector is capable of detecting a mixture of spatial coherence and divergence of a radiation beam of the lithographic apparatus.

2. The lithographic apparatus of claim 1, wherein the imaging detector is located before the focal plane of the optical element.

3. The lithographic apparatus of claim 1, wherein the radiation beam monitoring apparatus further comprises an analyzer configured to measure a property of an image detected by the imaging detector.

4. The lithographic apparatus of claim 3, wherein the analyzer is configured to compare the measured property with a threshold.

5. The lithographic apparatus of claim 3, wherein the property is determined by one of the following methods:
   deconvoluting the detected image with an existing image and measuring a width of a resulting profile, or
   measuring a contrast of the detected image, or
   cross-correlating the detected image with an existing image, or
   performing a grid deformation fit of the detected image.

6. The lithographic apparatus of claim 3, wherein the analyzer is configured to determine whether the radiation beam has a mixture of spatial coherence and divergence which would be likely to damage an optical component of the lithographic apparatus.

7. The lithographic apparatus of claim 1, wherein the optical element is a lens or a pinhole.

8. The lithographic apparatus of claim 1, wherein a distance between the optical element and the imaging detector is at least one quarter of a distance between the optical element and the focal plane.

9. The lithographic apparatus of claim 1, wherein a distance between the imaging detector and the focal plane is at least one quarter of a distance between the optical element and the focal plane.

10. The lithographic apparatus of claim 9, wherein the distance between the imaging detector and the focal plane is at least half of the distance between the optical element and the focal plane.

11. The lithographic apparatus of claim 1, wherein the radiation beam monitoring apparatus is provided in an illuminator of the lithographic apparatus, a beam delivery system of the lithographic apparatus, or a source of the lithographic apparatus.

12. The lithographic apparatus of claim 1, wherein the lithographic apparatus further comprises an illumination mode selector comprising an array of reflective elements which may be used to apply an illumination mode to the radiation beam.

13. The lithographic apparatus of claim 1, wherein the mixture of spatial coherence and divergence of the radiation beam is a measurement that is different from a measurement of spatial coherence of the radiation beam or a measurement of divergence of the radiation beam.

14. A monitoring method comprising using an optical element and an imaging detector which is not located in a focal plane of the optical element to obtain an image of a radiation beam of a lithographic apparatus, the image providing information relating to a mixture of spatial coherence and divergence of the radiation beam.

15. The method of claim 14, wherein a property of the image is determined and compared with a threshold value.

16. The method of claim 15, wherein the property is determined by one of the following methods:
   deconvoluting an image detected by the detector with an existing image and measuring a width of the resulting profile, or
   measuring a contrast of the detected image, or
   cross-correlating the detected image with an existing image, or
   performing a grid deformation fit of the detected image.

17. The method of claim 14, comprising determining whether the radiation beam has a mixture of spatial coherence and divergence which would be likely to damage an optical component of the lithographic apparatus or to generate a poor quality illumination mode.

* * * * *